(12) United States Patent
Iwao et al.

(10) Patent No.: US 11,139,147 B1
(45) Date of Patent: Oct. 5, 2021

(54) PLASMA PROCESSING APPARATUS

(71) Applicant: Tokyo Electron Limited, Tokyo (JP)

(72) Inventors: Toshihiko Iwao, Austin, TX (US); Takaaki Kato, Yamanashi (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 16/883,087

(22) Filed: May 26, 2020

(51) Int. Cl.
*H01J 37/32* (2006.01)

(52) U.S. Cl.
CPC .. *H01J 37/32174* (2013.01); *H01J 37/32165* (2013.01); *H01J 37/32623* (2013.01)

(58) Field of Classification Search
CPC ........... H01J 37/32192; H01J 37/32211; H01J 37/32238; H01J 37/32266; H01J 37/32559
See application file for complete search history.

(56) References Cited

U.S. PATENT DOCUMENTS

| | | | | |
|---|---|---|---|---|
| 6,427,621 B1 * | 8/2002 | Ikegawa | ........... | H01J 37/32266 118/723 MW |
| 9,971,970 B1 * | 5/2018 | Rigetti | ................... | G06N 10/00 |
| 2006/0137610 A1 * | 6/2006 | Yoshizaki | ........... | H01J 37/3244 118/723 E |
| 2010/0078315 A1 * | 4/2010 | Stowell | ............... | C23C 14/3471 204/192.22 |
| 2018/0211893 A1 * | 7/2018 | Ichino | ............... | H01L 21/67126 |
| 2019/0157045 A1 * | 5/2019 | Meloni | ............. | H01J 37/32238 |

FOREIGN PATENT DOCUMENTS

JP 2000-323456 11/2000

* cited by examiner

*Primary Examiner* — Tung X Le
(74) *Attorney, Agent, or Firm* — IPUSA, PLLC

(57) ABSTRACT

A plasma processing apparatus is provided, in which an electromagnetic wave in a VHF band of 100 MHz or higher is supplied to a chamber to form a plasma. The plasma processing apparatus includes a ceiling wall that defines a part of the chamber, and a central conductor for supplying the electromagnetic wave that is disposed in a hole formed in the center of the ceiling wall. A central position of the central conductor substantially coincides with a central position of a stage on which a workpiece is placed, and an outer diameter of the central conductor and a size of the hole of the ceiling wall are defined such that a cutoff frequency of a coaxial path composed of the central conductor and the ceiling wall is greater than a frequency of the electromagnetic wave.

17 Claims, 11 Drawing Sheets

| εr | 9.7 | Inner diameter d [mm] | | | | | | | | | |
|---|---|---|---|---|---|---|---|---|---|---|---|
| Outer diameter D [mm] | | 20 | 40 | 60 | 80 | 100 | 120 | 140 | 160 | 350 | |
| | 40 | 1021 | | | | | | | | | |
| | 60 | 766 | 613 | | | | | | | | |
| | 80 | 613 | 511 | 438 | | | | | | | |
| | 100 | 511 | 438 | 383 | 340 | | | | | | |
| | 120 | 438 | 383 | 340 | 306 | 278 | | | | | |
| | 140 | 383 | 340 | 306 | 278 | 255 | 236 | | | | |
| | 160 | 340 | 306 | 278 | 255 | 236 | 219 | 204 | | | |
| | 180 | 306 | 278 | 255 | 236 | 219 | 204 | 191 | 180 | | |
| | 200 | 278 | 255 | 236 | 219 | 204 | 191 | 180 | 170 | | |
| | 400 | 146 | 139 | 133 | 128 | 123 | 118 | 113 | 109 | 82 | |

(b)

| εr | 1 | Inner diameter d [mm] | | | | | | | | | |
|---|---|---|---|---|---|---|---|---|---|---|---|
| Outer diameter D [mm] | | 20 | 40 | 60 | 80 | 100 | 120 | 140 | 160 | 350 | |
| | 40 | 3180 | | | | | | | | | |
| | 60 | 2385 | 1908 | | | | | | | | |
| | 80 | 1908 | 1590 | 1363 | | | | | | | |
| | 100 | 1590 | 1363 | 1193 | 1060 | | | | | | |
| | 120 | 1363 | 1193 | 1060 | 954 | 867 | | | | | |
| | 140 | 1193 | 1060 | 954 | 867 | 795 | 734 | | | | |
| | 160 | 1060 | 954 | 867 | 795 | 734 | 681 | 636 | | | |
| | 180 | 954 | 867 | 795 | 734 | 681 | 636 | 596 | 561 | | |
| | 200 | 867 | 795 | 734 | 681 | 636 | 596 | 561 | 530 | | |
| | 400 | 454 | 434 | 415 | 398 | 382 | 367 | 353 | 341 | 254 | |

| εr | 9.7 | Inner diameter d [mm] | | | | | | | | | |
|---|---|---|---|---|---|---|---|---|---|---|---|
| | | 20 | 40 | 60 | 80 | 100 | 120 | 140 | 160 | 350 |
| Outer diameter D [mm] | 40 | 1021 | | | | | | | | |
| | 60 | 766 | 613 | | | | | | | |
| | 80 | 613 | 511 | 438 | | | | | | |
| | 100 | 511 | 438 | 383 | 340 | | | | | |
| | 120 | 438 | 383 | 340 | 306 | 278 | | | | |
| | 140 | 383 | 340 | 306 | 278 | 255 | 236 | | | |
| | 160 | 340 | 306 | 278 | 255 | 236 | 219 | 204 | | |
| | 180 | 306 | 278 | 255 | 236 | 219 | 204 | 191 | 180 | |
| | 200 | 278 | 255 | 236 | 219 | 204 | 191 | 180 | 170 | |
| | 400 | 146 | 139 | 133 | 128 | 123 | 118 | 113 | 109 | 82 |

A, B, C (annotations pointing to cells: A → 438 at D=80,d=60; C → 204 at D=160,d=140; B → 82 at D=400,d=350)

us 11,139,147 B1

PLASMA PROCESSING APPARATUS

TECHNICAL FIELD

The present disclosure relates to a plasma processing apparatus.

BACKGROUND ART

For example, Patent Document 1 describes a plasma processing apparatus for applying a predetermined plasma process to a substrate W to be processed. In the plasma processing apparatus, an upper electrode, which faces a lower electrode, is provided with an electrode plate. The electrode plate has an outer portion composed of a conductor or a semiconductor, and a central portion composed of a dielectric member or a member having a higher resistance than the outer portion. This suppresses non-uniformity of an electric field at the surface of the electrode when radio frequency electric power is applied to the upper electrode.

RELATED ART DOCUMENT

Patent Document

[Patent Document 1] Japanese Laid-open Patent Application Publication No. 2000-323456

SUMMARY OF INVENTION

Problem to be Solved by the Invention

The present disclosure provides a plasma processing apparatus capable of blocking the higher order mode propagation of VHF-band electromagnetic waves greater than 100 MHz, and producing a uniform plasma.

Means for Solving the Problem

According to one aspect of the present disclosure, there is provision of a plasma processing apparatus for applying a process to a workpiece, by supplying an electromagnetic wave in a VHF band of 100 MHz or higher to a chamber to form a plasma. The plasma processing apparatus includes a ceiling wall that defines a part of the chamber and is at a ground potential, and a central conductor disposed, via a dielectric window, in a hole formed in the center of the ceiling wall. The central conductor is configured to apply the electromagnetic wave. A central position of the central conductor substantially coincides with a central position of a stage on which the workpiece is placed, and an outer diameter of the central conductor and the size of the hole of the ceiling wall are defined such that a cutoff frequency of a coaxial path composed of the central conductor and the ceiling wall is greater than the frequency of the electromagnetic wave.

Effect of the Invention

According to one aspect, propagation of higher order modes of electromagnetic waves in the VHF band greater at a frequency of 100 MHz or higher can be blocked, and a uniform plasma can be generated.

BRIEF DESCRIPTION OF THE DRAWINGS

FIG. 4 illustrates tables each illustrating a relationship between dimensions and a cutoff frequency of a coaxial waveguide according to the embodiment;

FIG. 9 illustrates a table illustrating a relationship between dimensions and a cutoff frequency of a coaxial waveguide according to the embodiment;

MODE FOR CARRYING OUT OF THE INVENTION

Figure 1:
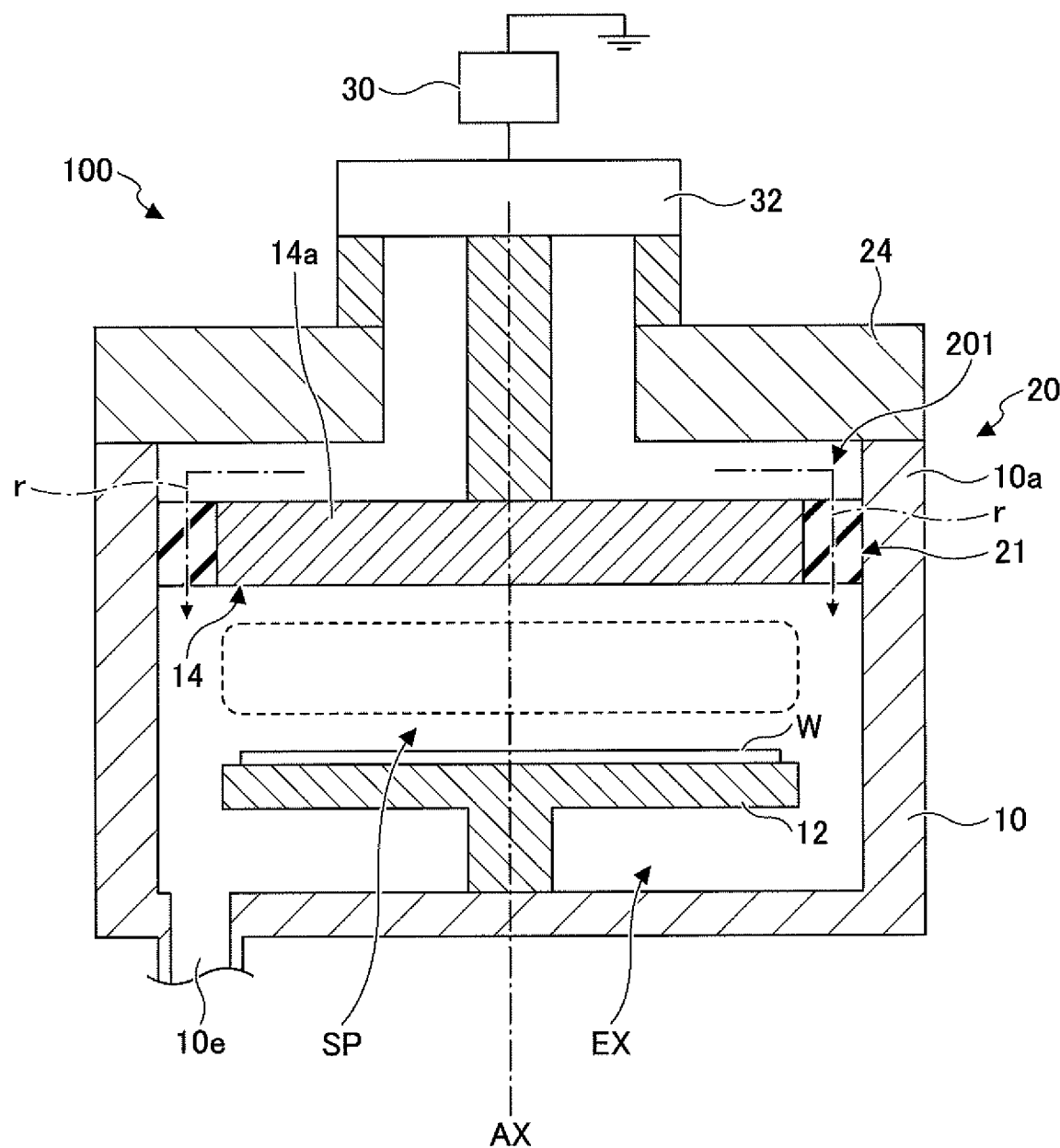
FIG. 1 is a cross-sectional diagram illustrating an example of a plasma processing apparatus according to a reference example.

Hereinafter, embodiments for carrying out the present disclosure will be described with reference to the drawings. In each drawing, the same components are indicated by the same reference numerals, and redundant descriptions may be omitted.

Reference Example

Figure 2:
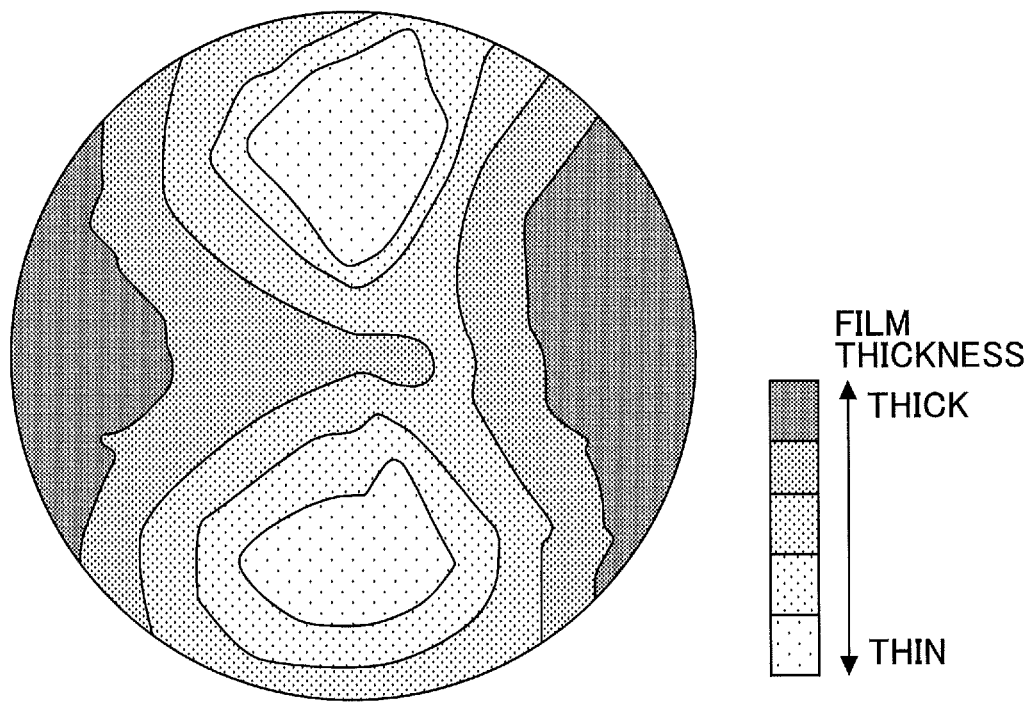
FIG. 2 is a diagram illustrating an example of a film thickness distribution that is deposited in the reference example.

Before describing a plasma processing apparatus 1 according to an embodiment, an example of a film thickness distribution when deposited by a plasma processing apparatus 100 according to a reference example will be described with reference to FIGS. 1 and 2. FIG. 1 is a cross-sectional diagram illustrating the plasma processing apparatus 100 according to the reference example. FIG. 2 is a diagram illustrating an example of the film thickness distribution that is deposited in the reference example.

The plasma processing apparatus 100 according to the reference example includes a chamber 10, a stage 12, an upper electrode 14, a coaxial waveguide 20, and a VHF power supply 30. The chamber 10 has a cylindrical shape and extends vertically. The central axis of the chamber 10 is the axis AX extending vertically.

The stage 12 is provided in the chamber 10, and a substrate W, which is an example of a workpiece, is placed on the stage 12. An exhaust port 10e is formed at the bottom of the chamber 10 below the stage 12. An exhaust device connected to the exhaust port 10e evacuates the chamber 10 through an exhaust space Ex.

The upper electrode 14 is provided above the stage 12 via a plasma processing space (hereinafter referred to as a "space SP") in the chamber 10. The upper electrode 14 is of a disc shape, and includes a central conductor 14a and a dielectric window 21. The stage 12 and the upper electrode 14 face with each other, and a plasma is generated in the space SP between the stage 12 and the upper electrode 14.

The plasma processing apparatus 100 includes a coaxial waveguide 20 (waveguide path r) for supplying electromagnetic waves to the space SP. The coaxial waveguide 20 is configured by a central conductor 14a, a ceiling wall 24, and an upper side wall 10a of the chamber 10 that is connected to the ceiling wall 24. The coaxial path 201 of the coaxial waveguide 20 is a part that introduces electromagnetic waves, such as VHF radio waves, into the space SP as illustrated in the waveguide path r.

The ceiling wall 24 and the upper side wall 10a of the chamber 10 define a part of the chamber 10, and are at a ground potential. The central conductor 14a constitutes an inner conductor of the coaxial waveguide 20. The ceiling wall 24 and the upper side wall 10a of the chamber 10 constitute an outer conductor of the coaxial waveguide 20. This allows the coaxial waveguide 20 to function in the same way as a coaxial cable.

The dielectric window 21 is an annular member provided at the tip of the coaxial path 201, and electromagnetic waves can pass through the dielectric window 21. The lower surface of the dielectric window 21 is exposed to the space SP, and the electromagnetic waves that have passed through the dielectric window 21 are emitted into the space SP.

Above the upper electrode 14, the VHF power supply 30 is electrically connected to the upper electrode 14 via a matcher 32. The VHF power supply 30 is a power supply that generates electromagnetic waves in the VHF band. The matcher 32 includes matching circuitry that causes impedance at the load side seen from the VHF power supply 30 to match output impedance of the VHF power supply 30. Due to such a configuration, electromagnetic waves are propagated to the dielectric window 21 in the coaxial path 201 as indicated by the waveguide path r. The electromagnetic waves passes through the dielectric window 21, and are supplied to the space SP from the lower surface of the dielectric window 21.

In general, electromagnetic waves at frequencies of 100 MHz or higher tend to propagate differently from electromagnetic waves at frequencies of 100 MHz or below. For example, when a radio frequency of 60 MHz or less is applied, a discharge phenomenon occurs between the upper electrode 14 and the stage 12 in accordance with Paschen's law, and a plasma based on a process gas is generated in the space SP. In contrast, when electromagnetic waves of 100 MHz or higher are applied to the upper electrode 14, the electromagnetic waves propagate so as to crawl along the surface (lower surface) of the upper electrode 14, and a surface wave plasma based on a process gas is generated near the surface of the upper electrode 14.

FIG. 2 illustrates an example of a film thickness distribution when the plasma processing apparatus 100 according to the reference example deposits a film on a 300 mm wafer as an example of a substrate. Process conditions during deposition of the film are as follows. As gases, silane gas ($SiH_4$), ammonia gas ($NH_3$), and helium gas (He) were used, and the pressure in the chamber was controlled to 600 mTorr (80 Pa). An electromagnetic wave in the VHF band at a frequency of 220 MHz and at power of 2700 W power was applied to form an insulating film.

As a result, as illustrated in FIG. 2, two thick portions of the film were formed on the left and right side of the outer periphery, and thin portions of the film were formed at portions rotated 90 degrees from the thick portion, resulting in a non-uniform film thickness distribution. The thickness distribution is one indicator of a plasma distribution.

In this experiment, the refractive index (RI), which indicates an example of quality of a film, was also measured. As a result, variation also occurred in the RI distribution. These results indicate that when a surface wave plasma is generated using electromagnetic waves of 100 MHz or higher, non-uniformity of the plasma distribution becomes a problem.

The non-uniformity of the plasma distribution result from modes of an electromagnetic wave. When electromagnetic waves are radiated from the coaxial path 201 into the space SP, the electromagnetic waves includes a fundamental mode and a higher order mode. It is considered that, because of the electromagnetic waves of the higher order mode, a surface wave plasma generated became non-uniform, resulting in non-uniformity of film quality. In particular, when the coaxial waveguide 201 propagates an electromagnetic wave at a frequency of 100 MHz or higher, electromagnetic waves in the higher order mode are generated, causing variation in film quality.

Therefore, in the plasma processing apparatus 1 according to the present embodiment, the coaxial waveguide 20 is designed such that propagation of electromagnetic waves in the higher order mode can be cut off. For example, TEM mode of an electromagnetic wave is a dominant mode. TE11 mode of an electromagnetic wave is a mode with the lowest order among higher order modes. Therefore, if propagation of an electromagnetic wave in the TE11 mode can be cut off, propagation of electromagnetic waves in any other modes higher than the TE11 mode can be cut off. Therefore, in the present embodiment, the coaxial waveguide 20 is designed to have a size capable of cut off propagation of the TE11 mode. This can block the propagation of electromagnetic waves in the TE11 mode and other higher order modes in the VHF band of 100 MHz or higher, create a uniform surface wave plasma, and make the film uniform. Hereinafter, a plasma processing apparatus 1 according to the present embodiment having a coaxial waveguide 20 designed to cut off propagation of the TE11 mode will be described.

[Plasma Processing Apparatus]

Figure 3:
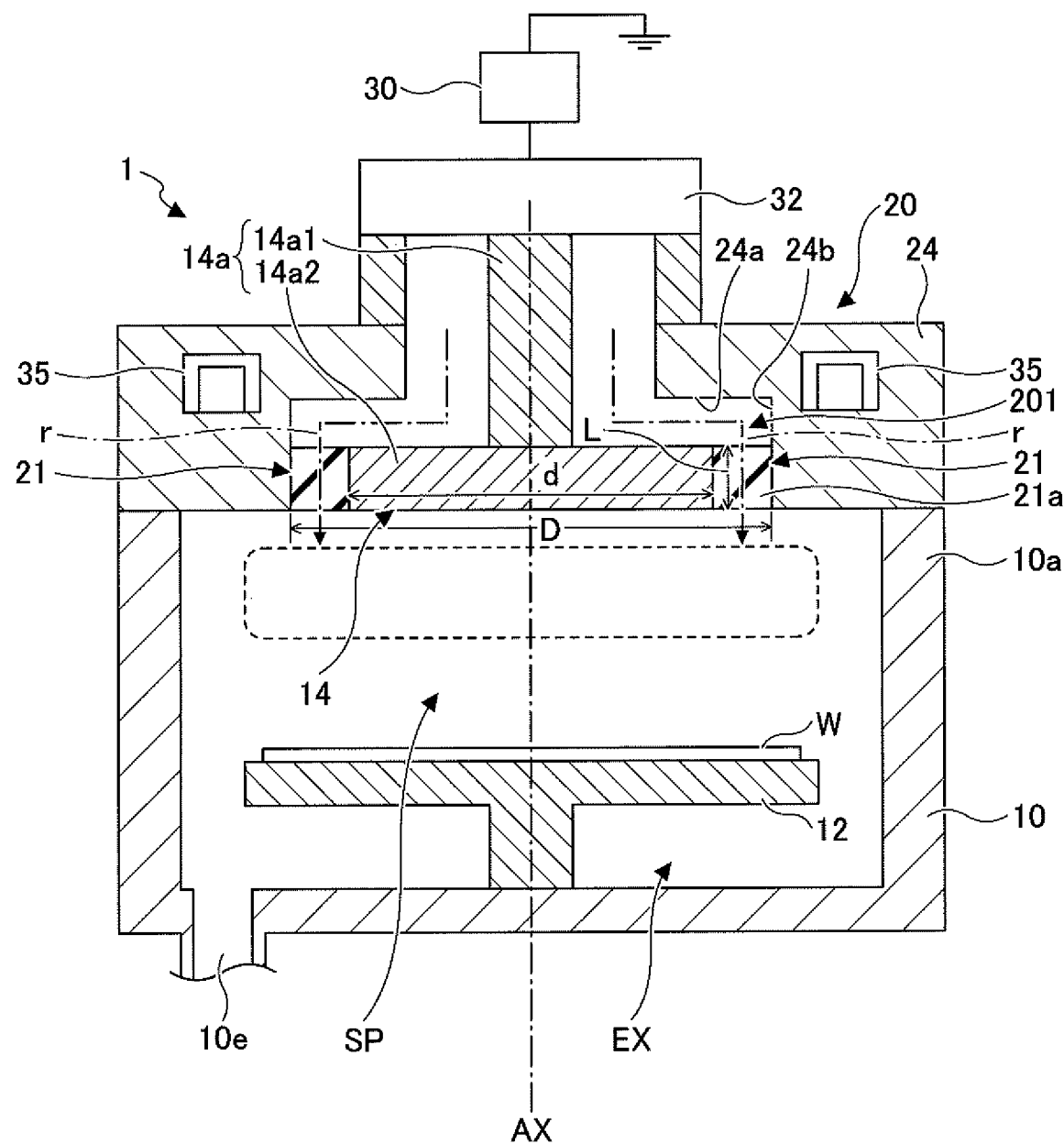
FIG. 3 is a cross-sectional diagram illustrating a plasma processing apparatus according to an embodiment.

The plasma processing apparatus 1 according to the present embodiment will be described with reference to FIG. 3. FIG. 3 is a cross-sectional diagram illustrating the plasma processing apparatus 1 according to the embodiment. The plasma processing apparatus 1 includes a chamber 10, a stage 12, an upper electrode 14, a coaxial waveguide 20, and a VHF power supply 30.

The chamber 10 has a cylindrical shape and extends vertically. The central axis of the chamber 10 is the axis AX extending vertically. The chamber 10 is formed from a conductor such as aluminum or an aluminum alloy. A corrosion resistant film is formed on the surface of the chamber 10. Examples of the corrosion resistant film include ceramic, such as aluminum oxide or yttrium oxide.

The stage 12 is provided in the chamber 10. The stage 12 is configured to substantially horizontally support a substrate W that is placed on the upper surface of the stage 12. The stage 12 has a disc shape. The central axis of the stage 12 approximately coincides with the axis AX.

An exhaust port 10e is formed at the bottom of the chamber 10 below the stage 12. An exhaust device is connected to the exhaust port 10e. The exhaust device includes a pressure control valve and a vacuum pump such as a turbomolecular pump and/or a dry pump. The exhaust device evacuates the chamber 10 through an exhaust space Ex.

The upper electrode 14 is disposed above the stage 12 via a space SP in the chamber 10. The upper electrode 14 has a disc shape. The stage 12 and the upper electrode 14 faces with each other, and a surface wave plasma is generated in the space SP between the stage 12 and the upper electrode 14. The surface wave plasma is generated near the surface of the upper electrode 14.

The plasma processing apparatus 1 includes a coaxial waveguide 20 (waveguide path r) for supplying electromagnetic waves to the space SP. The coaxial waveguide 20 is configured by a central conductor 14a and a ceiling wall 24, and introduces VHF electromagnetic waves at a frequency of 100 MHz or higher into the space SP from a coaxial path 201. The central conductor 14a constitutes an inner conductor of the coaxial waveguide 20. The ceiling wall 24 constitutes an outer conductor of the coaxial waveguide 20. Thus, the coaxial waveguide 20 configured by the central conductor 14a and the ceiling wall 24 has the same function as a coaxial cable.

The central axis of the ceiling wall 24 and the central conductor 14a substantially coincides with the axis AX. A through-hole formed at the center of the ceiling wall 24 is expanded within the ceiling wall 24 to form a step portion 24a, and thereby the central conductor 14a is placed in a space extending toward the outer periphery within the ceiling wall 24. That is, the central conductor 14a passes through the through-hole provided in the center of the ceiling wall 24, and is provided in the space extending outward in the ceiling wall 24. The ceiling wall 24 defines a part of the chamber 10, and is at a ground potential.

The central conductor 14a may be formed of a metal such as aluminum, or may be formed of other conductive materials. The central conductor 14a includes a shaft portion 14a1 and a widened portion 14a2 that radially expands below the shaft portion 14a1. The shaft portion 14a1 is cylindrical, and the widened portion 14a2 is of a disc shape. The central conductor 14a has a T-shaped longitudinal cross-sectional shape.

An electromagnet 35 is embedded in the ceiling wall 24 such that the electromagnet 35 is formed to be annular. As electrons in a plasma are confined in the magnetic flux of the electromagnet 35, high electron density in the plasma can be maintained. This allows the distribution of the plasma to be adjusted. The electromagnet 35 may be provided in at least one of the ceiling wall 24 and the side wall 10a of the chamber 10. However, the electromagnet 35 may be omitted.

The dielectric window 21 formed in the coaxial waveguide 20 are positioned at least at the tip of the coaxial path 201, and includes a first solid dielectric layer 21a that separates the interior of the coaxial path 201 from a plasma space. In the example of FIG. 3, the dielectric window 21 are composed of the first solid dielectric layer 21a, and the first solid dielectric layer 21a is disposed between the outer circumferential edge of the widened portion 14a2 and the inner side wall 24b of the ceiling wall 24. The thickness of the first solid dielectric layer 21a is approximately equal to the thickness L of the widened portion 14a2. That is, the first solid dielectric layer 21a is embedded throughout the coaxial path 201 which will be treated as a coaxial path for calculation purposes. Electromagnetic waves can pass through the first solid dielectric layer 21a. The lower surface of the first solid dielectric layer 21a is exposed to the space SP and the electromagnetic waves that have passed through the first solid dielectric layer 21a are emitted into the space SP.

Above the upper electrode 14, The VHF power supply 30 is electrically connected to the upper electrode 14 via a matcher 32. The VHF power supply 30 is a power supply that generates electromagnetic waves in the VHF band. In particular, in the present embodiment, the VHF power supply 30 outputs electromagnetic waves in the VHF band at a frequency of 100 MHz or higher. The matcher 32 includes matching circuitry for causing impedance at the load side seen from the VHF power supply 30 to match output impedance of the VHF power supply 30.

Electromagnetic waves are propagated from the VHF power supply 30 to the dielectric window 21 in the coaxial path 201, pass through the dielectric window 21, and are supplied to the space SP from the lower surface of the dielectric window 21. The electromagnetic waves to be used are VHF radio waves at a frequency of 100 MHz or higher and 300 MHz or less.

A gas line is formed in the ceiling wall 24 and the central conductor 14a. A gas supply source is connected to the gas line. The gas supply source supplies one or more gases used for processing the substrate W. The gas supply source also includes one or more flow controllers for controlling flow rates of the respective gases. The gas supplied into the gas line of the ceiling wall 24 and the central conductor 14a is discharged into the space SP through multiple gas discharge holes that open into the space SP.

The gas is excited by an electric field of a surface wave of the electromagnetic wave formed in the space SP, and a plasma (surface wave plasma) is formed from the gas. The substrate W on the stage 12 is processed by a chemical species within the plasma.

The stage 12 may be provided with a conductive layer for an electrostatic chuck and a conductive layer for a heater. When DC voltage from a DC power supply is applied to the conductive layer for the electrostatic chuck, electrostatic attractive force is generated between the stage 12 and the substrate W. The substrate W is attracted to the stage 12 by the generated electrostatic attractive force, and is held by the stage 12.

The plasma processing apparatus 1 may further include a baffle member. The baffle member extends between the stage 12 and the side wall of the chamber 10. The baffle member is an annular plate. Multiple through-holes are formed in the baffle member.

The plasma processing apparatus 1 may further include a controller 40. The controller 40 may be a computer including a processor, a storage section such as a memory, an input device, a display device, an input/output interface of a signal, and the like. The controller 40 controls each part of the plasma processing apparatus 1. At the controller 40, an operator can perform operations such as a command input operation using the input device, to manage the plasma processing apparatus 1. Further, in the controller 40, the operation status of the plasma processing apparatus 1 can be visualized and displayed by the display device. Further, a control program and recipe data are stored in the storage section. The control program is executed by the processor to perform various processes in the plasma processing apparatus 1. The processor executes the control program, and controls each part of the plasma processing apparatus 1 according to recipe data. Thus, the electromagnetic waves in the VHF band at a frequency of 100 MHz or higher are applied to the central conductor 14a, and a process is applied to the substrate W by the generated plasma.

[Dimension of Coaxial Waveguide and Cutoff Frequency]

In the plasma processing apparatus 1, dimensions of the coaxial waveguide 20 are designed such that propagation of the TE11 mode is cut off. The dimensions of the coaxial waveguide 20 to cut off propagation of the TE11 mode are defined by the outer diameter of the central conductor 14a and a size of the hole of the ceiling wall 24. In the present embodiment, the outer diameter of the central conductor 14a and the size of the hole of the ceiling wall 24 are defined such that a cutoff frequency of the coaxial path 201 composed of the central conductor 14a and the ceiling wall 24 is equal to or greater than twice a frequency of an electromagnetic wave in the VHF band to be applied into the chamber 10 at a frequency of 100 MHz or higher.

Hereinafter, a result of a simulation will be described, which was performed in order to optimize the outer diameter of the central conductor 14a and the hole size of the ceiling wall 24 such that the TE11 mode is cut off. In the example of FIG. 3, the size of the outer diameter of the central conductor 14a is the diameter d of the widened portion 14a2, and the hole size of the ceiling wall 24 is the diameter D of the inner side wall 24b of the ceiling wall 24 facing the outer circumferential side wall of the widened portion 14a2. The length of the coaxial path 201 (coaxial path length L) illustrated in FIG. 3 is equal to the thickness of the widened portion 14a2.

FIG. 4 illustrates tables illustrating a relationship between the size of the outer diameter of the central conductor 14a, the hole size of the ceiling wall 24, and the cutoff frequency according to the embodiment. The values in the table indicate combinations of the size of the inner diameter d and the outer diameter D at the cutoff frequency fc. FIG. 4(a) illustrates the relationship between the outer diameter of the central conductor 14a (the diameter of the widened portion 14a2), the hole in the ceiling wall 24 (the diameter D of the inner side wall 24b of the ceiling wall), and the cutoff frequency, in a case in which alumina having relative permittivity $\varepsilon_r$ of 9.7 is used for the first solid dielectric layer 21a. In FIG. 4, the diameter d of the widened portion 14a2 is denoted by an inner diameter d [mm], and the diameter D of the inner side wall 24b of the ceiling wall is denoted by an outer diameter D [mm].

[Coaxial Waveguide Having an Inner Diameter d of 60 Mm and an Outer Diameter D of 80 mm]

For example, the coaxial waveguide 20, in which the first solid dielectric layer 21a is alumina ($\varepsilon_r$=9.7), the inner diameter d is 60 mm, and the outer diameter D is 80 mm, will be described. According to FIG. 4(a), the cutoff frequency fc of the coaxial waveguide 20 is 438 MHz. In other words, in a case in which an electromagnetic wave at frequency f greater than 438 MHz is applied from the VHF power supply 30, electromagnetic waves of the higher order modes are propagated without attenuation. In contrast, in the coaxial waveguide 20 of the above-described size, in a case in which an electromagnetic wave at a frequency f below 438 MHz is applied from the VHF power supply 30, propagation of electromagnetic waves of the higher order modes can be suppressed. It is possible to sufficiently attenuate higher order modes of an electromagnetic wave at frequency f less than 219 MHz, which satisfies the condition of f<fc/2 with a safety factor of twice.

Figure 5:
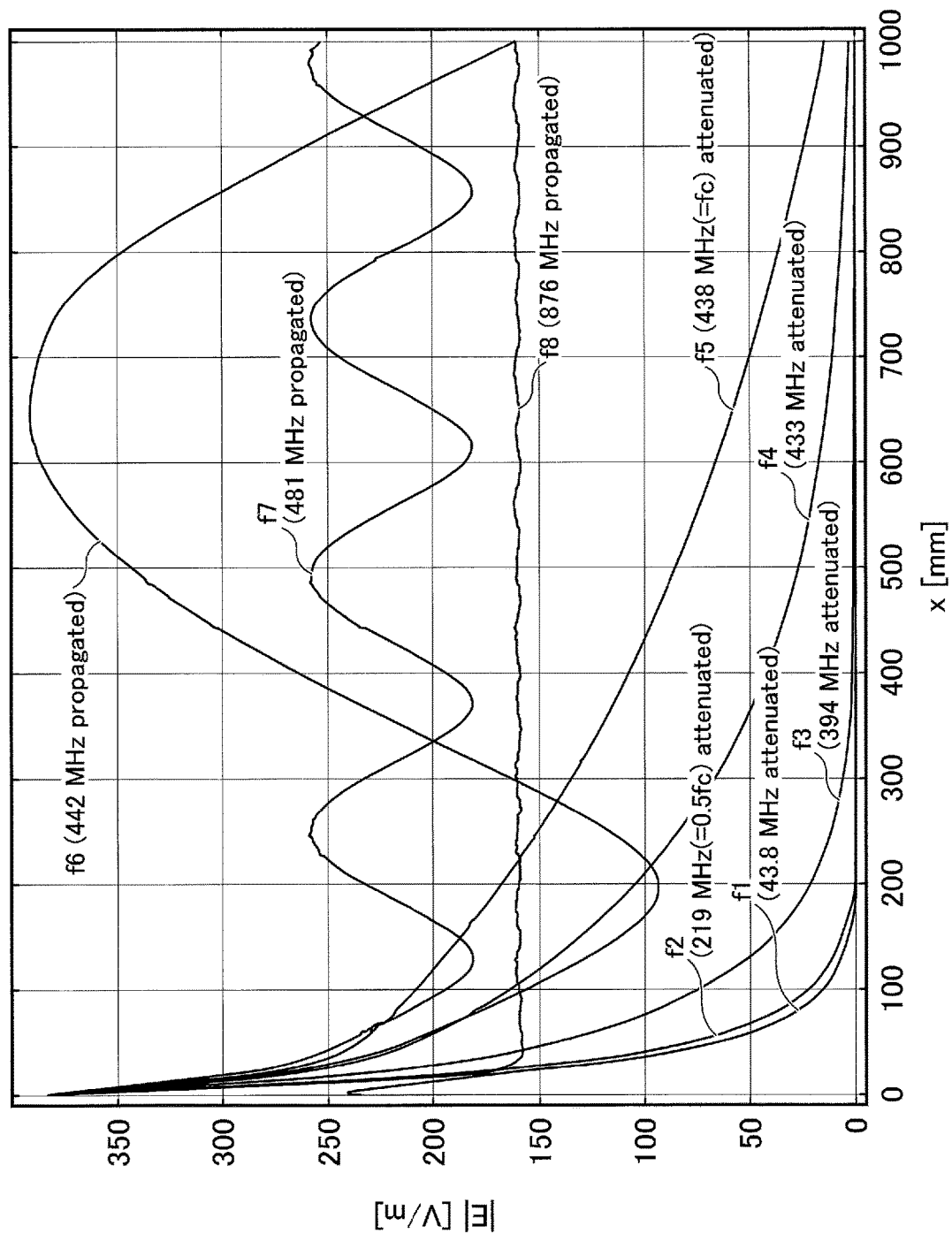
FIG. 5 is a diagram illustrating an example of the cutoff frequency and attenuation of an electromagnetic wave according to the embodiment.

FIG. 5 is a diagram illustrating an example of a cutoff frequency and attenuation of an electromagnetic wave according to the embodiment. The horizontal axis indicates the distance x from a port at which an electromagnetic field is excited, in a direction of the coaxial path, and the vertical axis indicates the complex amplitude |E| of intensity of the electric field. The coaxial waveguide 20 of d=60 mm and D=80 mm, whose cutoff frequency fc is 438 MHz, attenuates higher order modes of a frequency below 438 MHz, and sufficiently attenuates electromagnetic waves of higher order modes at a frequency f of 219 MHz (=fc/2) or less. For example, electric fields of electromagnetic waves at frequency f1 (43.8 MHz) and frequency f2 (219 MHz) are monotonically reduced and sufficiently attenuated in the coaxial waveguide 20.

Meanwhile, in the coaxial waveguide 20 of the same size, electromagnetic waves in higher order modes of frequency f greater than 438 MHz, which satisfies the condition of f>fc, are not attenuated, and are propagated in the coaxial waveguide 20. For example, electromagnetic fields of electromagnetic waves at frequency f6 (442 MHz), frequency f7 (481 MHz), and frequency f8 (876 MHz) greater than the cutoff frequency f5 (=fc) do not monotonically decrease in the coaxial waveguide 20, and are propagated in the coaxial waveguide 20.

Figure 6:
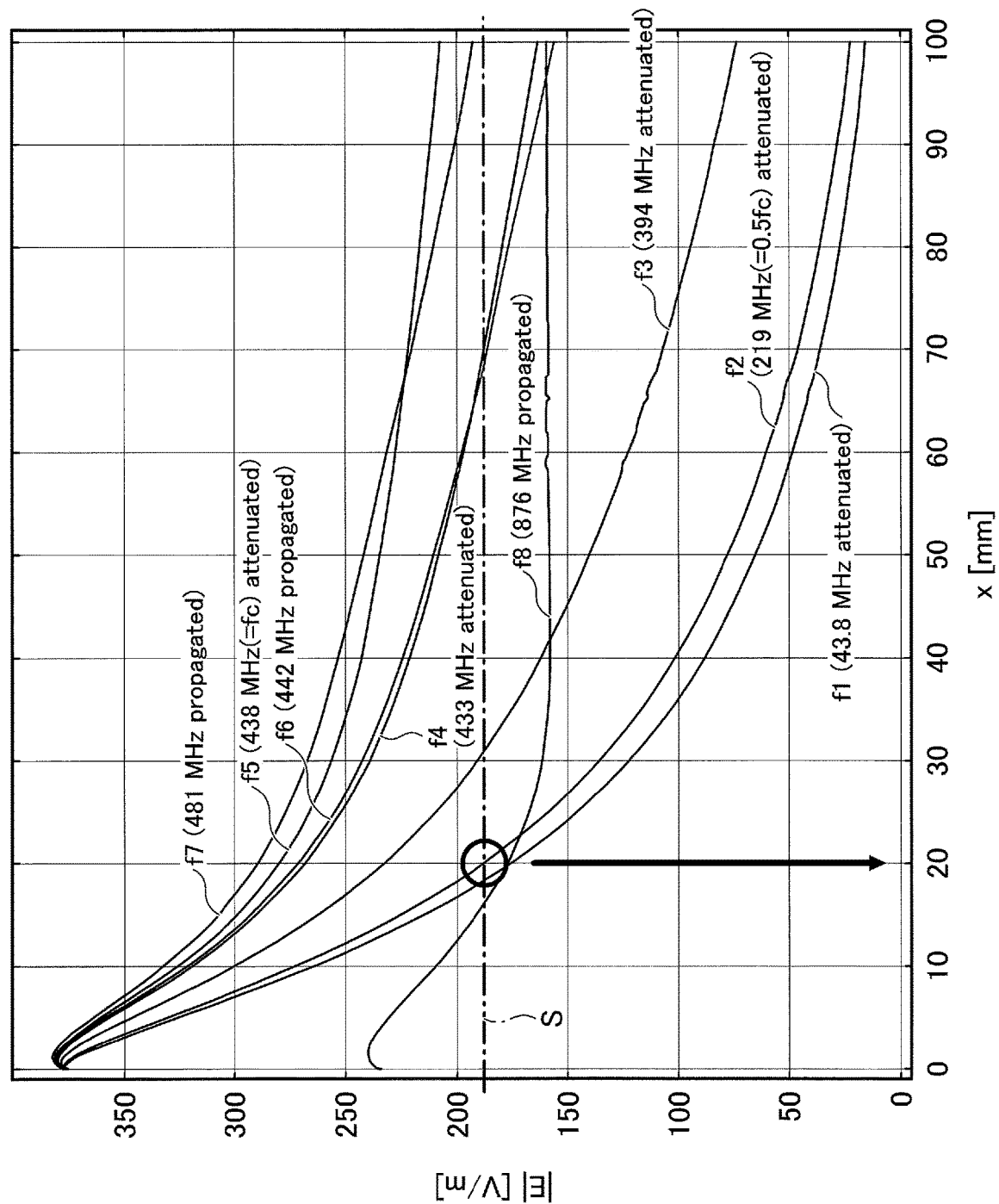
FIG. 6 is an enlarged view of an area in FIG. 5 corresponding to a range of the coaxial path length L up to 100 mm.

FIG. 6 is an enlarged view of an area in FIG. 5 corresponding to a range of the coaxial path length L up to 100 mm. The dashed-dotted line S indicates a half-value of the electric field of the excited electromagnetic wave. Referring to FIG. 6, it can be seen that the coaxial path length L needs to be at least 20 mm in order to attenuate electric fields of electromagnetic waves at frequency f1 (43.8 MHz) and frequency f2 (219 MHz) to an electric field indicated by the dashed-dotted line S.

As illustrated in FIG. 5, electromagnetic waves of the higher order modes at frequency f that meet the condition of fc>f≥fc/2, which is equal to or greater than 219 MHz and equal to or less than 438 MHz, are attenuated, but the degree of attenuation is less than that of electromagnetic waves in the higher order modes at frequency f that meets the condition of f<fc/2. For example, as illustrated in FIG. 5, electric fields of the electromagnetic waves at frequencies f3 (394 MHz) and f4 (433 MHz) are monotonically reduced and attenuated in the coaxial waveguide 20. However, the amount of attenuation per unit distance is less than that of the electromagnetic waves at frequency f1 and frequency f2. The attenuation of the electric field of the electromagnetic wave at frequency f5 (438 MHz) is even less.

In addition, as illustrated in FIG. 6, in order to attenuate the electric field of the electromagnetic wave of frequency f3 (394 MHz) to an electric field indicated by the dotted line S, the coaxial path length L must be at least 30 mm. In a case of the electromagnetic wave of frequency f4 (433 MHz), the coaxial path length L needs to be even longer.

In view of the above, it is preferable to define the dimensions of the outer diameter d of the central conductor 14a and the inner diameter D of the hole of the ceiling wall 24 such that the cutoff frequency fc of the coaxial path 201 composed of the central conductor 14a and the ceiling wall 24 is equal to or greater than twice the frequency of the electromagnetic wave to be applied. This allows electromagnetic waves in the higher order modes of electromagnetic waves in the VHF band at a frequency of 100 MHz or higher to be attenuated sufficiently. In addition, by reducing the diameter of the widened portion 14a2, it is possible to suppress a phenomenon in which the density of the plasma at the center of a wafer is higher than the density of the plasma at the outer periphery of the wafer. As a result, a uniform plasma can be produced.

However, the outer diameter d of the central conductor 14a and the inner diameter D of the hole of the ceiling wall 24 may be defined so that the cutoff frequency fc of the coaxial path 201 composed of the central conductor 14a and the ceiling wall 24 is greater than the frequency of the electromagnetic wave to be applied. This also generally attenuates propagation of higher order modes of electromagnetic waves in the VHF band at a frequency of 100 MHz or higher.

Figure 7:
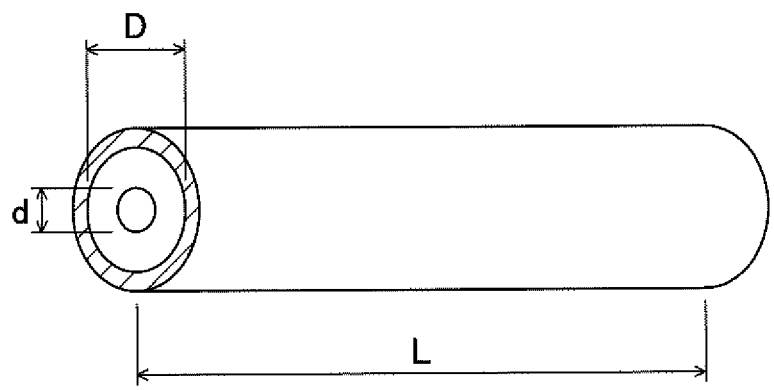
FIG. 7 is a diagram for explaining the cutoff frequency.

The cutoff frequency fc used in this simulation will be briefly described with reference to FIG. 7. FIG. 7 is a diagram for explaining the cutoff frequency fc. As illustrated in FIG. 7, let the outer diameter of the inner conductor of the coaxial waveguide be d, and let the inner diameter of the outer conductor be D. The cutoff frequency fc is calculated by the following formula (1):

[Formula 1]
$$fc = \frac{2c}{\pi\sqrt{\varepsilon r}\,(D+d)} \quad (1)$$

where c is the speed of light ($3\times10^8$ [m/s]) and $\varepsilon_r$ is a relative permittivity of a dielectric.

The region indicated by an arrow A in FIG. 4(a) indicates values of the cutoff frequency fc that are equal to or greater than twice the frequency of 200 MHz, which is the condition of the electromagnetic wave in the simulation. If the outer diameter d of the central conductor 14a and the inner diameter D of the hole of the ceiling wall 24 are defined such that each of the outer diameter d of the central conductor 14a and the inner diameter D of the hole of the ceiling wall 24 becomes a size corresponding to the cutoff frequency fc within the region A, electromagnetic waves in the TE11 mode and other higher order modes can be sufficiently attenuated when an electromagnetic wave at a frequency of 200 MHz is applied. This allows a uniform plasma to be generated.

The region indicated by an arrow B in FIG. 4(a) indicates values of the cutoff frequency fc that are less than the frequency of 200 MHz which is the condition of the electromagnetic wave in the simulation. If the outer diameter d of the central conductor 14a and the inner diameter D of the hole of the ceiling wall 24 are defined such that each of the outer diameter d of the central conductor 14a and the inner diameter D of the hole of the ceiling wall 24 becomes a size corresponding to the cutoff frequency fc within the region B, electromagnetic waves in the TE11 mode and other higher order modes propagate and cannot be blocked when an electromagnetic wave at a frequency of 200 MHz is applied.

In a case in which the outer diameter d of the central conductor 14a is 60 mm and the inner diameter D of the hole of the ceiling wall 24 is 80 mm, the coaxial path length L is determined to be at least 20 mm, as illustrated in FIG. 6. If the coaxial path length L is determined to be 40 mm, higher order modes can be further attenuated sufficiently. Further, if the outer diameter d of the central conductor 14a and the inner diameter D of the hole of the ceiling wall 24 are defined such that each of the outer diameter d of the central conductor 14a and the inner diameter D of the hole of the ceiling wall 24 becomes a size corresponding to a cutoff frequency fc not included in the region A or the region B, electromagnetic waves in the higher order modes of a frequency f satisfying the condition of fc>f≥fc/2 will be attenuated. However, the amount of the attenuation is smaller than that of the electromagnetic waves in the higher order modes at frequency f satisfying the condition of f<fc/2 in the region A.

It is difficult to define the dimensions of the coaxial path 201 at a distance from the plasma so as to suppress propagation of electromagnetic waves in the higher order modes. In contrast, it is possible to suppress propagation of electromagnetic waves in the higher order modes by defining the dimensions of the central conductor 14a and the hole of the ceiling wall 24, both of which are close to the plasma.

Further, as described above, by reducing the diameter of the widened portion 14a2 of the central conductor 14a so as to have a size having a cutoff frequency fc within the region A, an electric field distribution caused by a surface wave of an electromagnetic wave propagating in the upper electrode 14 can be more uniformly generated, and a uniform plasma can be generated in a radial direction as well as a circumferential direction. In addition, by confining electrons in a plasma in the magnetic flux of the electromagnet 35, electron density of the plasma can be controlled.

FIG. 4(b) illustrates the relationship between the dimensions of the coaxial waveguide 20 and the cutoff frequency when a space layer in a vacuum space, whose relative permittivity $\varepsilon_r$ is 1, is used in the coaxial path 201.

Figure 8:
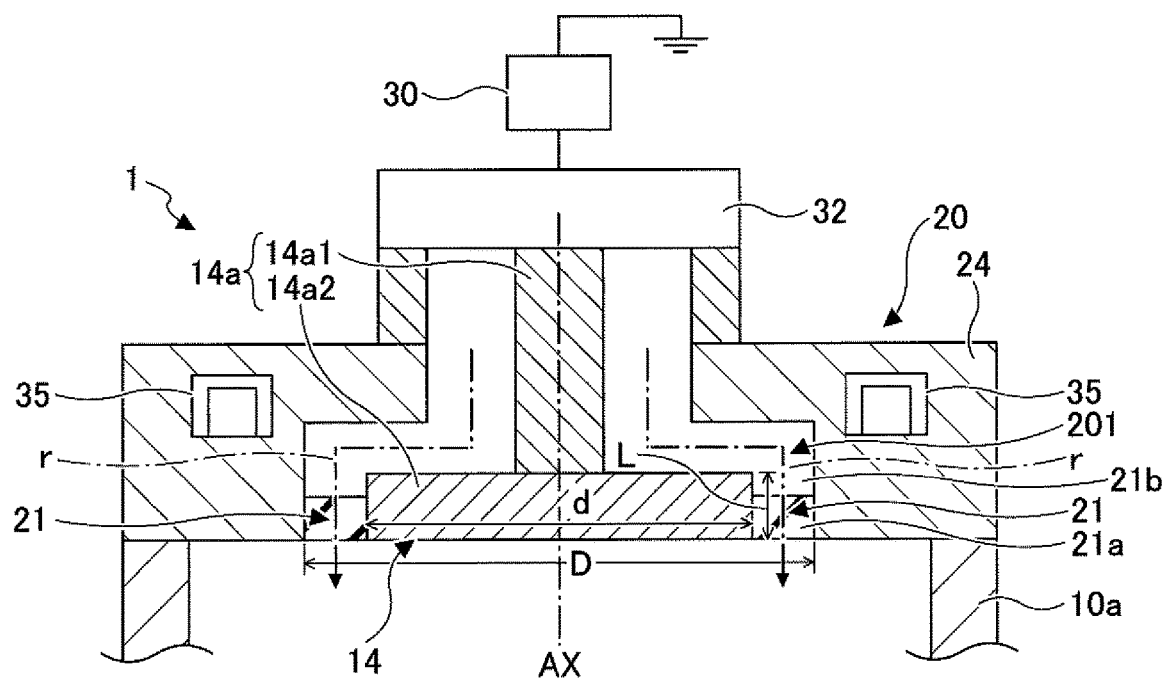
FIG. 8 is diagrams each illustrating an upper electrode of a plasma processing apparatus according to a variation of the embodiment.
Figure 8:
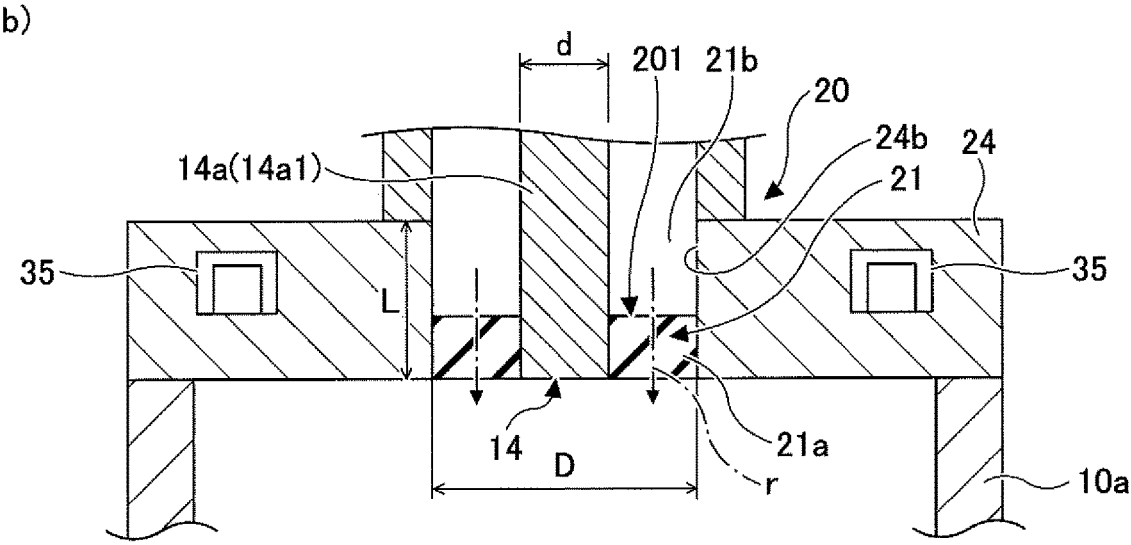

For example, FIG. 8 illustrates diagrams of examples of an upper electrode 14 of a plasma processing apparatus 1 according to a variation of the embodiment. As illustrated in FIG. 8(a), a first solid dielectric layer 21a may be used in a portion of the coaxial path 201, and a space layer 21b may be included in the other portion. In this case, the thickness of the first solid dielectric layer 21a is less than the thickness of the widened portion 14a2.

If the space layer 21b is in a vacuum space with a relative permittivity lower than that of the first solid dielectric layer 21a, with respect to the portion of the space layer 21b, an area in which a cutoff frequency fc is equal to or greater than twice the electromagnetic wave of 200 MHz expands, as illustrated in the region A of FIG. 4(b). As the area of the cutoff frequency fc becomes wider, a wider range of electromagnetic waves in higher order modes can be cut off. Therefore, definable ranges of the outer diameter d of the central conductor 14a and the inner diameter D of the hole of the ceiling wall 24 are widened, and degrees of freedom in design is increased.

However, it is necessary to provide the first solid dielectric layer 21a at the tip of the coaxial path 201 in order to separate the coaxial path 201 from the plasma space and in order to prevent a plasma from entering the coaxial path 201. The thickness of the first solid dielectric layer 21a may be less than or equal to ¼ of the coaxial path length L. In addition, the thickness of the first solid dielectric layer 21a may be 5 mm or greater, in terms of mechanical strength. If the dielectric window 21 is composed of the first solid dielectric layer 21a and the space layer 21b as illustrated in FIG. 8(a), a range of the cutoff frequency fc is expanded, and degrees of freedom in design and/or a range of electromagnetic waves in higher order modes that can be cut off can be widened.

The dielectric window 21 may have a first solid dielectric layer 21a in a portion of the dielectric window 21, and in another portion, the dielectric window 21 may have a second solid dielectric layer with a lower relative permittivity than the first solid dielectric layer 21a.

The first solid dielectric layer 21a may be, for example, a material of alumina ($Al_2O_3$), aluminum nitride (AlN), or quartz. The first solid dielectric layer 21a may be a material having a lower relative permittivity than alumina, aluminum nitride, and quartz. The second solid dielectric layer is a material having a lower relative permittivity than the first solid dielectric layer 21a.

[Coaxial Waveguide Having an Inner Diameter d of 140 mm and an Outer Diameter D of 160 mm]

Next, a coaxial waveguide with an inner diameter d of 140 mm and an outer diameter D of 160 mm will be described. FIG. 9 is a diagram illustrating the relationship between the dimensions of the coaxial waveguide 20 according to the embodiment and the cutoff frequency fc. For example, the cutoff frequency fc of the coaxial waveguide 20 having the inner diameter d of 140 mm and the outer diameter D of 160 mm is 204 MHz, as indicated in the cell C. Therefore, the coaxial waveguide 20 of the above-described size can sufficiently attenuate electromagnetic waves in the higher order modes of frequency f less than 102 MHz that satisfies the condition of f<fc/2. In contrast, the coaxial waveguide 20 having the inner diameter d of 140 mm and the outer diameter D of 160 mm propagates electromagnetic waves of higher order modes of frequency f greater than 204 MHz that satisfies the condition of f>fc, without attenuation.

Figure 10:
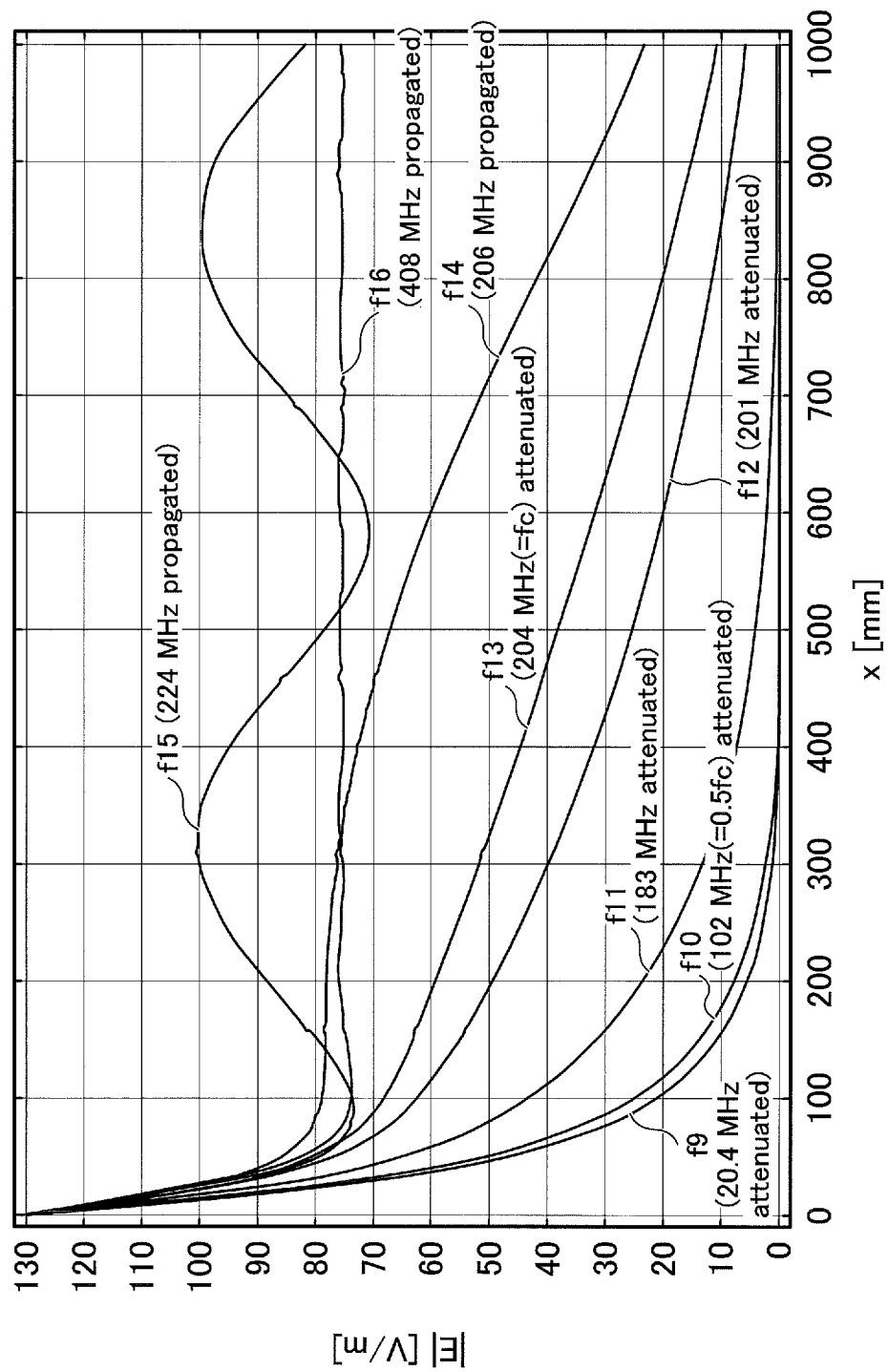
FIG. 10 is a diagram illustrating an example of the cutoff frequency and attenuation of an electromagnetic wave according to the embodiment.

FIG. 10 is a diagram illustrating an example of a cutoff frequency and attenuation of an electromagnetic wave according to the embodiment. The horizontal axis indicates the distance x from a port at which an electromagnetic field is excited, in a direction of the coaxial path, and the vertical axis indicates the complex amplitude JEI of intensity of the electric field. The coaxial waveguide 20 of d=140 mm and D=160 mm, whose cutoff frequency fc is 204 MHz, can sufficiently attenuate electromagnetic waves in higher order modes of frequency f of 102 MHz or less that satisfies the condition of f<fc/2. For example, electric fields of electromagnetic waves at frequency f9 (20.4 MHz) and frequency f10 (102 MHz) are monotonically reduced and sufficiently attenuated in the coaxial waveguide 20.

Meanwhile, in the coaxial waveguide 20 of the same size, electromagnetic waves in higher order modes of frequency f greater than 204 MHz, which satisfies the condition of f>fc, propagate without attenuation. For example, electromagnetic waves at frequency f14 (206 MHz), frequency f15 (224 MHz), and frequency f16 (408 MHz) do not monotonically decrease in the coaxial waveguide 20, and are propagated in the coaxial waveguide 20.

Figure 11:
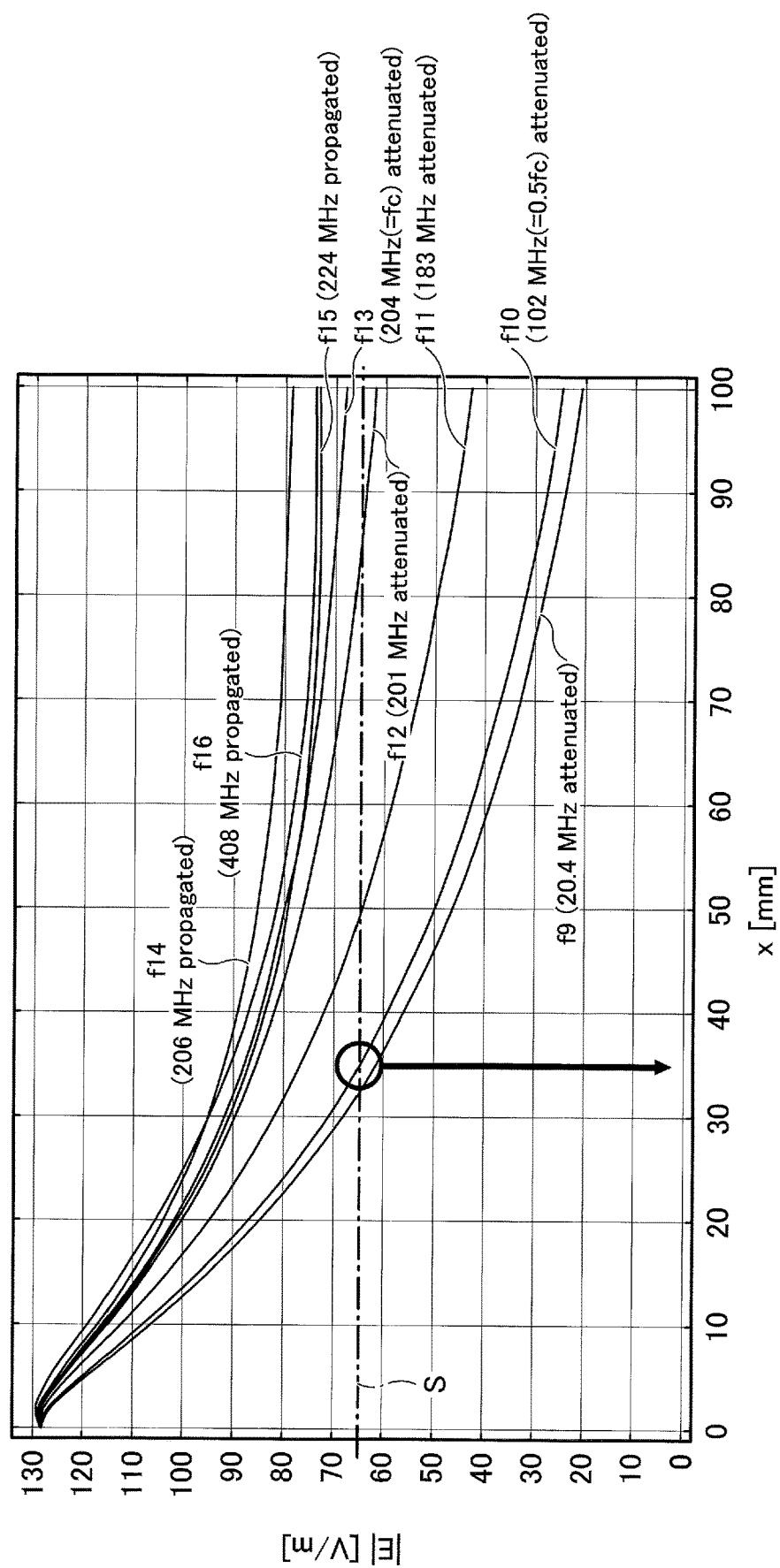
FIG. 11 is an enlarged view of an area in FIG. 10 corresponding to a range of the coaxial path length L up to 100 mm.

FIG. 11 is an enlarged view of an area in FIG. 10 corresponding to a range of the coaxial path length L up to 100 mm, which indicates the coaxial path length L required for the electric field of the excited electromagnetic wave to be reduced by half. The dashed-dotted line S indicates a half-value of the electric field of the excited electromagnetic wave. Referring to FIG. 11, it can be seen that the coaxial path length L needs to be at least 35 mm in order to sufficiently attenuate electric fields of electromagnetic waves at frequency f9 (20.4 MHz) and frequency f10 (102 MHz) to an electric field indicated by the dashed-dotted line S. In order to sufficiently attenuate an electric field of an electromagnetic wave at frequency f11 to the electric field indicated by the dashed-dotted line S, the coaxial path length L needs to be even longer.

As illustrated in FIG. 10, electromagnetic waves in higher order modes of frequency f greater than 102 MHz and less than 204 MHz attenuate, but the degree of attenuation is less than that of electromagnetic waves in the higher order modes at frequency f not greater than 102 MHz. For example, as illustrated in FIG. 10, electric fields of electromagnetic waves at frequency f11 (183 MHz) and frequency f12 (201 MHz) are monotonically reduced and attenuated in the coaxial waveguide 20. However, the attenuation is less than that of the electromagnetic waves at frequency f9 and frequency f10. Attenuation of the electric field of the electromagnetic wave at frequency f13 (204 MHz) is even less.

In view of the above, it is preferable that the dimensions of the outside diameter d of the central conductor 14a and the inside diameter D of the hole of the ceiling wall 24 be defined so that the cutoff frequency fc of the coaxial path 201 composed of the central conductor 14a and the ceiling wall 24 is equal to or greater than twice the frequency of an electromagnetic wave to be applied. This ensures that propagation of higher order modes of electromagnetic waves in the VHF band at a frequency of 100 MHz or higher band is blocked and, suppresses a phenomenon in which density of a plasma at the center of a wafer becomes higher than density of a plasma at the outer periphery of the wafer, thereby producing a uniform plasma.

The coaxial waveguide 20 may be configured to function as a coaxial cable such that the central conductor 14a serves as an inner conductor and the ceiling wall 24 serves as an outer conductor, even though at least one of the central conductor 14a and the ceiling wall 24 includes some uneven portions.

As another configuration of the coaxial waveguide 20, FIG. 8(b) illustrates an upper electrode 14 of a plasma processing apparatus 1 according to another variation of the embodiment. In FIG. 8(b), the upper electrode 14 is provided at a through-hole in a ceiling wall 24. In this case, the through-hole of the ceiling wall 24 is the inner side wall 24b of the ceiling wall 24, which corresponds to the hole in the ceiling wall 24.

In this case, a central conductor 14a has only a shaft portion 14a1, and does not have a widened portion. The central conductor 14a has an I-shaped longitudinal cross-sectional shape. The outer diameter d of the central conductor 14a is the diameter of the shaft portion 14a1, and the hole size of the ceiling wall 24 is the inner diameter D of the inner side wall 24b of the ceiling wall 24. The dielectric window 21 is composed of a first solid dielectric layer 21a and a space layer 21b in a vacuum space having a lower relative permittivity than the first solid dielectric layer 21a. In this case, the coaxial path length L is the thickness of the ceiling wall 24. The thickness of the first solid dielectric layer 21a is thinner than the coaxial path length L.

In the example illustrated in FIG. 8(b), the outer diameter d of the central conductor 14a and the inner side wall 24b of the ceiling wall 24 are defined such that the cutoff frequency fc of the coaxial path 201 composed of the central conductor 14a and the ceiling wall 24 is higher than a frequency of an electromagnetic wave in the VHF band to be applied at a frequency of 100 MHz or higher. This can block propagation of electromagnetic waves in the TE11 mode and other higher order modes to produce a uniform plasma.

As described above, in the plasma processing apparatus 1 according to the present embodiment, propagation of electromagnetic waves in higher order modes of electromagnetic waves in the VHF band at 100 MHz or higher can be cut off, and a uniform plasma can be generated. Further, by reducing the diameter of the upper electrode 14, uniformity of the plasma in a radial direction as well as in a circumferential direction can be achieved. By providing the electromagnet 35 in the ceiling wall 24 or the side wall 10a to confine electrons in a plasma in the magnetic flux of the electromagnet 35, electron density of the plasma can be controlled, and the uniformity of the plasma can be further improved.

The plasma processing apparatus according to the embodiment disclosed herein should be considered only as an example in all respects, and should not be considered to be restrictive. The above embodiments may be modified and enhanced in various forms without departing from the appended claims and the gist thereof. Matters described in the above embodiments may take other configurations to an extent not inconsistent, and may be combined to an extent not inconsistent.

The plasma processing apparatus 1 is not limited to a deposition apparatus, as long as the plasma processing apparatus 1 is an apparatus in which a predetermined process is applied to a substrate using a plasma. The plasma processing apparatus 1 may be an etching apparatus, an ashing apparatus, or the like.

DESCRIPTION OF SYMBOLS

1 Plasma processing apparatus
10 Chamber
12 Stage
14 Upper electrode
14a Central conductor
14a1 Shaft portion
14a2 Widened portion
20 Coaxial waveguide
21 Dielectric window
21a First solid dielectric layer
21b Space layer
24 Ceiling wall
24b Inner side wall of the ceiling wall
30 VHF power supply
35 Electromagnet
40 Controller
201 Coaxial path
W Substrate

What is claimed is:

1. A plasma processing apparatus for applying a process to a workpiece, by supplying an electromagnetic wave in a VHF band of 100 MHz or higher to a chamber to form a plasma, the plasma processing apparatus comprising:
  a ceiling wall that defines a part of the chamber and is at a ground potential; and
  a central conductor disposed in a hole formed in a center of the ceiling wall via a dielectric window, the central conductor being configured to apply the electromagnetic wave; wherein
  a central position of the central conductor substantially coincides with a central position of a stage on which the workpiece is placed,
  an outer diameter of the central conductor and a size of the hole of the ceiling wall are defined such that a cutoff frequency of a coaxial path composed of the central conductor and the ceiling wall is greater than a frequency of the electromagnetic wave,
  the dielectric window is provided at least at an end of the coaxial path, and
  the dielectric window includes a first solid dielectric layer that separates an interior of the coaxial path from a plasma space.

2. The plasma processing apparatus according to claim 1, wherein the outer diameter of the central conductor and the size of the hole of the ceiling wall are defined such that the cutoff frequency of the coaxial path is equal to or greater than twice the frequency of the electromagnetic wave.

3. The plasma processing apparatus according to claim 1, wherein a coaxial path length of the coaxial path is 20 mm or more.

4. The plasma processing apparatus according to claim 1, wherein
  the dielectric window is provided within the coaxial path, and
  the dielectric window includes a second solid dielectric layer or a space layer, each of the second solid dielectric layer and the space layer having a lower relative permittivity than the first solid dielectric layer.

5. The plasma processing apparatus according to claim 4, wherein the space layer is a vacuum space.

6. The plasma processing apparatus according to claim 1, wherein the first solid dielectric layer is a material of alumina, aluminum nitride, or quartz, or a material having a lower relative permittivity than alumina, aluminum nitride, or quartz.

7. The plasma processing apparatus according to claim 1, wherein a thickness of the first solid dielectric layer is less than or equal to a one fourth of a coaxial path length of the coaxial path.

8. The plasma processing apparatus according to claim 1, wherein at least one of the ceiling wall and a side portion of the chamber includes an electromagnet.

9. A plasma processing apparatus for applying a process to a workpiece, by supplying an electromagnetic wave in a VHF band of 100 MHz or higher to a chamber to form a plasma, the plasma processing apparatus comprising:
  a ceiling wall that defines a part of the chamber and is at a ground potential; and
  a central conductor disposed in a hole formed in a center of the ceiling wall via a dielectric window, the central conductor being configured to apply the electromagnetic wave; wherein
  a central position of the central conductor substantially coincides with a central position of a stage on which the workpiece is placed,
  an outer diameter of the central conductor and a size of the hole of the ceiling wall are defined such that a cutoff frequency of a coaxial path composed of the central conductor and the ceiling wall is greater than a frequency of the electromagnetic wave,
  the central conductor has an I-shaped longitudinal cross-sectional shape or a T-shaped longitudinal cross-sectional shape,
  in a case in which the central conductor has the I-shaped longitudinal cross-sectional shape, the outer diameter of the central conductor is a diameter of a shaft portion of the central conductor, and
  in a case in which the central conductor has the T-shaped longitudinal cross-sectional shape, the outer diameter of the central conductor is a diameter of a widened portion of the central conductor.

10. The plasma processing apparatus according to claim 9, wherein the outer diameter of the central conductor and the size of the hole of the ceiling wall are defined such that the cutoff frequency of the coaxial path is equal to or greater than twice the frequency of the electromagnetic wave.

11. The plasma processing apparatus according to claim 9, wherein a coaxial path length of the coaxial path is 20 mm or more.

12. The plasma processing apparatus according to claim 9, wherein the dielectric window is provided at least at an end of the coaxial path, and the dielectric window includes a first solid dielectric layer that separates an interior of the coaxial path from a plasma space.

13. The plasma processing apparatus according to claim 12, wherein
  the dielectric window is provided within the coaxial path, and
  the dielectric window includes a second solid dielectric layer or a space layer, each of the second solid dielectric layer and the space layer having a lower relative permittivity than the first solid dielectric layer.

14. The plasma processing apparatus according to claim 13, wherein the space layer is a vacuum space.

15. The plasma processing apparatus according to claim 12, wherein the first solid dielectric layer is a material of alumina, aluminum nitride, or quartz, or a material having a lower relative permittivity than alumina, aluminum nitride, or quartz.

16. The plasma processing apparatus according to claim 12, wherein a thickness of the first solid dielectric layer is less than or equal to a one fourth of a coaxial path length of the coaxial path.

17. The plasma processing apparatus according to claim 9, wherein at least one of the ceiling wall and a side portion of the chamber includes an electromagnet.

* * * * *